(12) United States Patent
Hutchinson

(10) Patent No.: US 8,422,340 B2
(45) Date of Patent: Apr. 16, 2013

(54) METHODS FOR DETERMINING THE FREQUENCY OR PERIOD OF A SIGNAL

(75) Inventor: Andrew Hutchinson, Williamsburg, VA (US)

(73) Assignee: General Electric Company, Schenectady, NY (US)

(*) Notice: Subject to any disclaimer, the term of this patent is extended or adjusted under 35 U.S.C. 154(b) by 880 days.

(21) Appl. No.: 12/329,978

(22) Filed: Dec. 8, 2008

(65) Prior Publication Data
US 2010/0141240 A1 Jun. 10, 2010

(51) Int. Cl.
*G04F 10/00* (2006.01)

(52) U.S. Cl.
USPC .......................................... 368/120

(58) Field of Classification Search .................. 368/120; 324/76.39; 713/178
See application file for complete search history.

(56) References Cited

U.S. PATENT DOCUMENTS

| | | | |
|---|---|---|---|
| 3,753,111 A | | 8/1973 | Denbnovetsky et al. |
| 4,433,919 A | * | 2/1984 | Hoppe .......................... 368/120 |
| 4,439,046 A | * | 3/1984 | Hoppe .......................... 368/120 |
| 4,544,884 A | | 10/1985 | Hayashi et al. |
| 4,786,861 A | * | 11/1988 | Hulsing et al. ............. 324/76.42 |
| 4,908,784 A | * | 3/1990 | Box et al. ........................ 702/176 |
| 5,270,666 A | | 12/1993 | Rapeli et al. |
| 5,337,335 A | | 8/1994 | Cloetens et al. |
| 5,684,760 A | * | 11/1997 | Hunter .......................... 368/120 |
| 5,694,377 A | * | 12/1997 | Kushnick ..................... 368/120 |
| 5,703,838 A | * | 12/1997 | Gorbics et al. ................ 368/120 |
| 5,764,045 A | | 6/1998 | Hayashi et al. |
| 5,793,709 A | * | 8/1998 | Carley .......................... 368/113 |
| 5,796,682 A | | 8/1998 | Swapp |
| 5,818,797 A | | 10/1998 | Watanabe et al. |
| 5,867,453 A | | 2/1999 | Wang et al. |
| 5,903,176 A | | 5/1999 | Westgate |

(Continued)

FOREIGN PATENT DOCUMENTS

| | | |
|---|---|---|
| EP | 0434293 A3 | 6/1991 |
| EP | 0484629 A1 | 5/1992 |
| WO | 03/012467 A1 | 2/2003 |

OTHER PUBLICATIONS

PCT/US2009/062925, Search Report and Written Opinion, Feb. 11, 2009.

(Continued)

*Primary Examiner* — Sean Kayes
(74) *Attorney, Agent, or Firm* — Global Patent Operation; Mark A. Conklin

(57) ABSTRACT

Methods for determining timestamps for signal timing edges for use in, e.g., a reciprocal counter for determining the frequency of a signal is disclosed, comprising the steps of inputting the signal into a tapped delay line, producing a plurality of delay line tap signals at the output of each of the delay line taps. In one embodiment, after detecting the signal timing edge and determining an initial time value corresponding to the timer clock cycle count at the signal timing edge or the next clock timing edge, the delay line tap signals are monitored to determine a fractional correction time value adjustment to be made to the initial value to account for the delay between the signal timing edge and the next clock timing edge to determine the timestamp. In another embodiment, after detecting the signal timing edge, the average of a plurality of delay line timer clock cycle counts corresponding to the timer clock cycle counts at the delay line tap signal timing edges is used to determine the timestamp.

20 Claims, 2 Drawing Sheets

U.S. PATENT DOCUMENTS

| | | | |
|---|---|---|---|
| 5,903,522 A * | 5/1999 | Carley | 368/118 |
| 6,081,484 A | 6/2000 | West | |
| 6,501,706 B1 | 12/2002 | West | |
| 6,597,213 B1 | 7/2003 | Weintraub | |
| 6,741,522 B1 | 5/2004 | Lin | |
| 6,944,099 B1 | 9/2005 | Preuss et al. | |
| 7,339,853 B2 * | 3/2008 | Srikantam et al. | 368/113 |
| 2007/0274434 A1 | 11/2007 | Arkas et al. | |

OTHER PUBLICATIONS

Rahkonen, T., Kostamovaara, J., Saynajakangas, S., Time Interval Measurements Using Integrated Tapped CMOS Delay Lines, Proceedings of the 32nd Midwest Symposium, Circuits and Systems, pp. 202-204 (Aug. 14-16, 1989).

* cited by examiner

US 8,422,340 B2

METHODS FOR DETERMINING THE FREQUENCY OR PERIOD OF A SIGNAL

BACKGROUND OF THE INVENTION

This invention relates generally to methods for determining the frequency or period of a signal, and more specifically to methods for determining a timestamp for a timing edge of a signal.

The frequency (f) of a repetitive (or periodic) signal can be defined by the number of cycles (M) of that signal that occur during a particular time interval (t). There are several known methods for determining the frequency of a signal, which is also referred to as frequency counting. Two basic types of frequency counting are direct counting and reciprocal counting.

A direct counter counts the number of signal cycles (M) for a known time interval (e.g., 1 second). If the time interval is equal to one second (t=1 s), the frequency is expressed as the number of cycles per second or the number of cycles Hertz (Hz).

On the other hand, rather than count the number of signal cycles to determine frequency (f), a reciprocal counter determines the period (T) of the signal, which can be determined by measuring the time interval (t) for completion of a single signal cycle (T=t). Once the period of a signal has been determined, the frequency of that signal can be determined by the reciprocating the period (f=1/T) to calculate the number of signal cycles per second or the number of signal cycles Hz. Alternatively, rather than measuring the time interval for completion of a single signal cycle, the period can be determined by measuring the time interval ($t_M$) for completion of a known number of signal cycles (M) and dividing that time interval by the number of signal cycles (T=$t_M$/M). Once again, the frequency of that signal can be determined by calculating the reciprocal of the period (f=1/T=M/$t_M$). Accordingly, in order to determine the time interval, reciprocal counting requires the determination of the start of a signal cycle and the start of the next signal cycle (or some other known signal cycle (e.g., every ten signal cycles) and associating a timestamp with each of those events.

The timestamps for these signal cycle start times can be provided in terms of a count of the number of clock cycles of a timer clock signal (e.g., timer clock cycle 100) or a time equivalent to the timer clock cycle count (i.e., timer clock cycle 100 for a timer clock signal having a timer clock period of 100 ns is equivalent to a time of 10 ms (100 timer clock cycles multiplied by 100 ns/timer clock cycle)). If the timestamps a provided in terms of the number of timer clock cycles, the number of timer clock cycles that occurred during the signal cycle can be multiplied by the timer clock period to determine the time interval. If the timestamps are provided as times equivalent to the timer clock cycle count, the time interval can be determined by subtracting the first timestamp from the second timestamp. Given this dependence on the timer clock cycle count, the accuracy of a conventional reciprocal counter is dependent on the speed of a timer clock. For example, if a timer clock is operating at 10 MHz (i.e., timer clock cycle occurs every 100 ns), the resolution of the reciprocal counter is 100 ns. This correlation between timer clock speed and resulting resolution is explained by way of the following illustrative example starting at t=0.

Assume that the first signal timing edge (e.g., a particular rising edge or falling edge that starts a signal cycle) for a signal cycle is detected at t=95 ns when the timer clock cycle count is equal to 001. Since the timer clock cycle count is equal to 001 from t=0 ns to 100 ns during the first timer clock period (i.e., until the second timer clock cycle occurs at 100 ns), regardless of when the first signal timing edge is detected during this first timer clock period, the timer clock cycle count will be equal to 001. Assume now that the second signal timing edge is detected at time=405 ns when the timer clock cycle count is equal to 005. Once again, since the timer clock cycle count is equal to 005 from t=400 ns to 500 ns during the fifth timer clock period, regardless of when the second signal timing edge of the signal is detected during this fifth timer clock period, the timer counter will be equal to 005. Accordingly in this example, the reciprocal counter has timestamped the first and second signal timing edges with the timer counts or times equivalent to the timer counts (i.e., a timer count of 001 is equivalent to a time of 100 ns and a timer count of 005 is equivalent to a time of 500 ns)

In order to determine the time interval (or period (T)) for this single cycle of the signal, the first timestamp (100 ns or timer clock cycle 001) is subtracted from the second timestamp (500 ns or timer clock cycle 005) to provide a time interval of 400 ns. This time interval for a single signal cycle is equivalent to a frequency of 2.5 MHz. As shown in this example, however, the actual time interval for the signal cycle (from 95 ns to 405 ns) was only 310 ns rather than 400 ns, representing an error of 90 ns between the determined time interval (400 ns=2.50 MHz) and the actual time interval (310 ns=3.23 MHZ).

This error can be reduced by the use of a faster timer clock, which would reduce the timer clock period and improve resolution. For example, if a timer clock was operating at 20 MHz instead of 10 MHz (i.e., each timer clock cycle has a period of 50 ns instead of 100 ns), the first signal timing edge is detected at t=95 ns when the timer clock cycle count is equal to 002 (second timer clock cycle) equivalent to a time of 100 ns, while the second signal timing edge is detected at time=405 ns when the timer clock cycle count is equal to 009 equivalent to a time of 450 ns. This would provide a determined time interval of 350 ns (seven timer clock cycles multiplied by the timer clock period (i.e., 50 ns)), which would reduce the error between the determined time interval (350 ns=2.86 MHz) and the actual time interval (310 ns=3.23 MHZ).

While increasing the speed of a timer clock improves the resolution of the reciprocal counter, this also increases the power consumption and resulting heat generation of the system. In systems that require battery power or cannot effectively dissipate the additional heat, such an increase in timer clock speed may not be an option. Furthermore, significant increases in timer clock speed require that the complementary electronics have the capacity to operate at these higher speeds, which can increase the cost of a system.

Given the disadvantages of increasing the speed of a timer clock to improve the resolution of a reciprocal counter, other systems have sought to improve system resolution without necessarily increasing the speed of a timer clock through the use of delay lines. However, in these systems, the delay lines are attached to a timer clock, which typically operates at significantly greater speeds than the signal that is being measured. Accordingly, while these delay line systems somewhat diminish the increase in power consumption that would be required by increasing timer clock speed, the required increase in the number of devices operating at a timer clock speed still results in an increase in power consumption, heat generation, and cost.

It would be advantageous to significantly improve the resolution of a reciprocal counter without having to significantly increase timer clock speed or power consumption.

BRIEF DESCRIPTION OF THE INVENTION

Methods for determining timestamps for signal timing edges for use in, e.g., a reciprocal counter for determining the frequency of a signal is disclosed, comprising the steps of inputting the signal into a tapped delay line, producing a plurality of delay line tap signals at the output of each of the delay line taps. In one embodiment, after detecting the signal timing edge and determining an initial time value corresponding to the timer clock cycle count at the signal timing edge or the next clock timing edge, the delay line tap signals are monitored to determine a fractional correction time value adjustment to be made to the initial value to account for the delay between the signal timing edge and the next clock timing edge to determine the timestamp. In another embodiment, after detecting the signal timing edge, the average of a plurality of delay line timer clock cycle counts corresponding to the timer clock cycle counts at the delay line tap signal timing edges is used to determine the timestamp.

DETAILED DESCRIPTION OF THE INVENTION

Methods for determining the frequency (f) or period ($T_S$) of an asynchronous signal 200 are disclosed. In each of these embodiments of the invention, reciprocal counters are used to provide higher resolution for determining more accurate timestamps (TS) for the signal timing edges.

Figure 1:
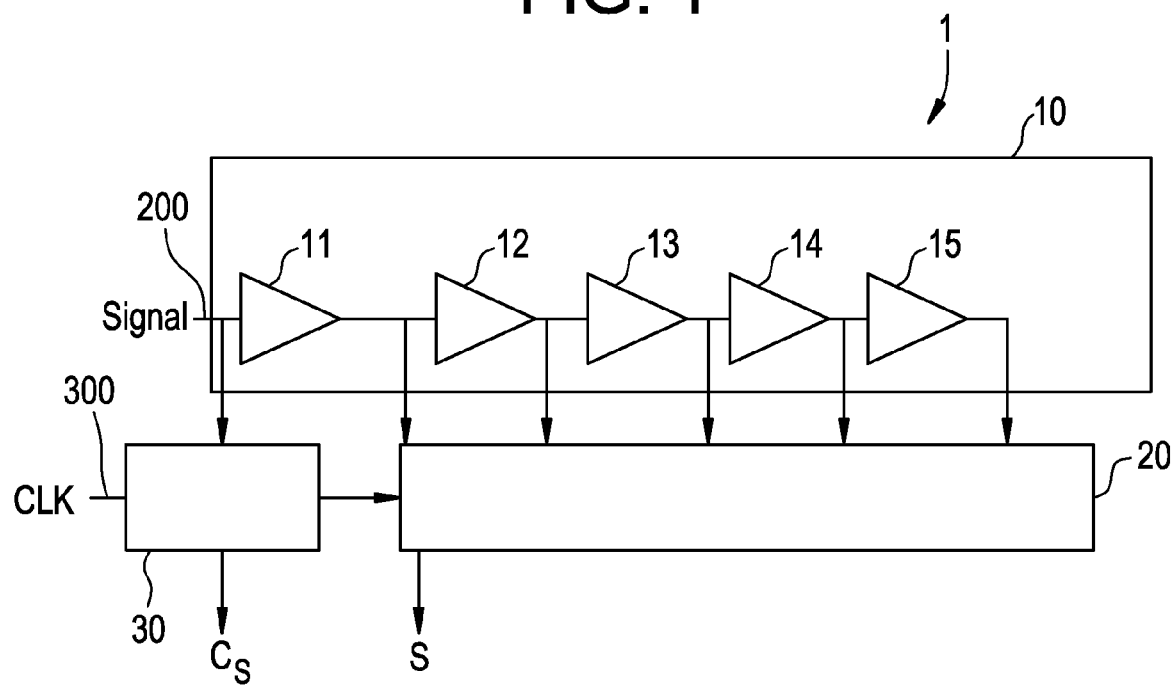
FIG. 1 is a block diagram of a five-stage reciprocal counter using a delay line latch in one embodiment of the invention.
Figure 2:
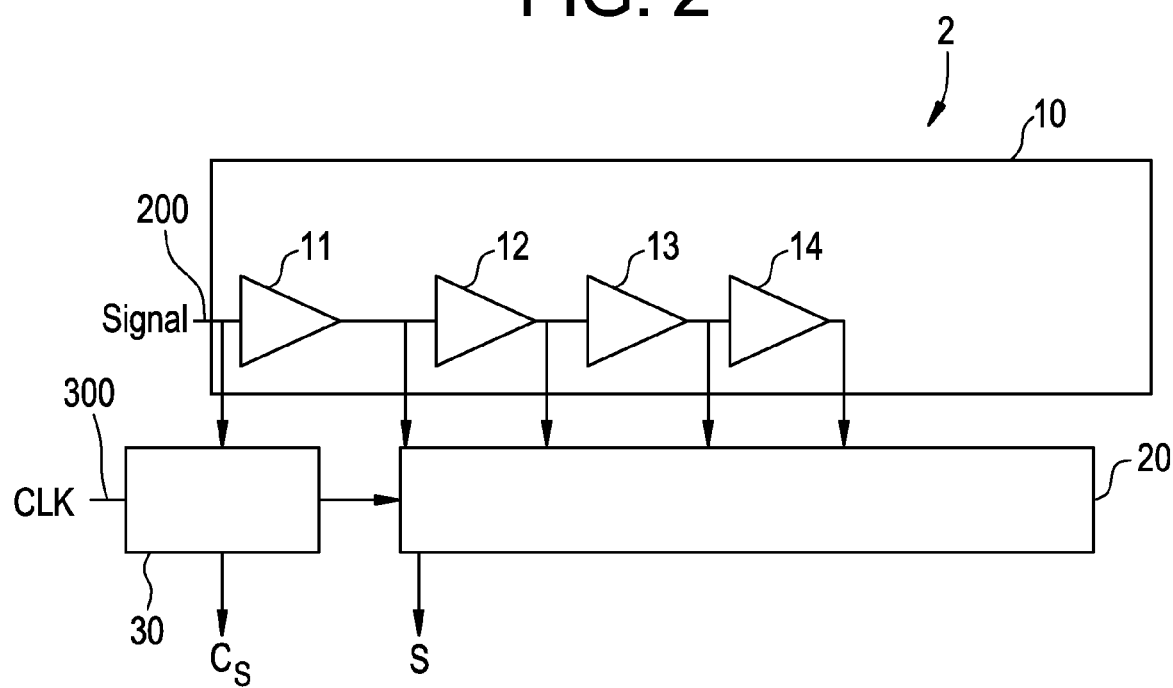
FIG. 2 is a block diagram of a four-stage reciprocal counter using a delay line latch in another embodiment of the invention.

FIGS. 1 and 2 depict block diagrams of reciprocal counters 1, 2 that can be used to practice the invention using a delay line latches 20 with multiple stage tapped delay lines 10, with each delay line tap (i.e., first delay line tap 11, second delay line tap 12, third delay line tap 13, fourth delay line tap 14, and fifth delay line tap 15) in series delaying the signal 200 by delay line tap time delays (e.g., an equal time delay for each or different time delays for each) less than the timer clock period ($T_C$). As will be demonstrated, the reciprocal counters 1, 2 can improve the resolution for determining the frequency (f) or period ($T_S$) of the signal 200 over the resolution provided by the timer clock signal 300 by a factor (R) depending upon the number of delay line taps (N) and states (S) for the tapped delay line 10.

For example, to improve the resolution of a conventional reciprocal counter with a timer clock speed of 10 MHz with a resolution of 100 ns by a desired resolution improvement factor of five (F=5) (i.e., equivalent to a conventional reciprocal counter having a timer clock speed of 50 MHz with a resolution of 20 ns), a tapped delay line 10 having five delay line taps (N=F) in series as in FIG. 1 or at least four delay line taps (N=F−1) in series as in FIG. 2 can be provided. The delay line tap time delay ($t_D$) for each delay can be equal to the period ($T_C$) of the timer clock signal 300 divided by the desired resolution improvement factor ($t_D=T_C/F$) to provide delay line tap time delays along the multiple stage tapped delay line 10 that are integer sub-multiples of the timer clock period ($T_C$). Using the example of a 10 MHz timer clock signal ($T_C$=100 ns) with a desired resolution improvement factor of five, the delay line tap time delay ($t_D$) for each would be 20 ns. Alternatively, the delay line tap time delay ($t_D$) for each delay need not be equal or integer sub-multiples of the timer clock period ($T_C$), but instead can be some other known subdivisions of the timer clock period ($T_C$). A skilled artisan will appreciate the fact that embodiments with different numbers of stages and states, and different delay line tap time delays can be used with and are within the scope and the spirit of the invention.

Referring again to FIG. 1, the reciprocal counter 1 has a five-stage tapped delay line 10 (N=5), while in FIG. 2, the reciprocal counter 2 has a four-stage tapped delay line 10 (N=4). In each of the reciprocal counters 1, 2, the signal 200 is received at the input of the tapped delay line 10, with each of the delay line taps in series delaying the signal by delay line tap time delays (e.g., equal time delays). Accordingly, and as shown in the exemplary timing diagram of FIG. 3, the output of each of the delay line taps is the signal 200 delayed in time by the sum of the delay line tap time delays of the preceding delay line taps in series (e.g., the second delay line tap signal 212 is delayed by two delay line tap time delays 11, 12, while the third delay line tap signal 213 is delayed by three delay line tap time delays 11, 12, 13). The outputs of each of the delay line taps are connected to a delay line latch 20 that provides the state (S) of the tapped delay line 10.

Figure 3:
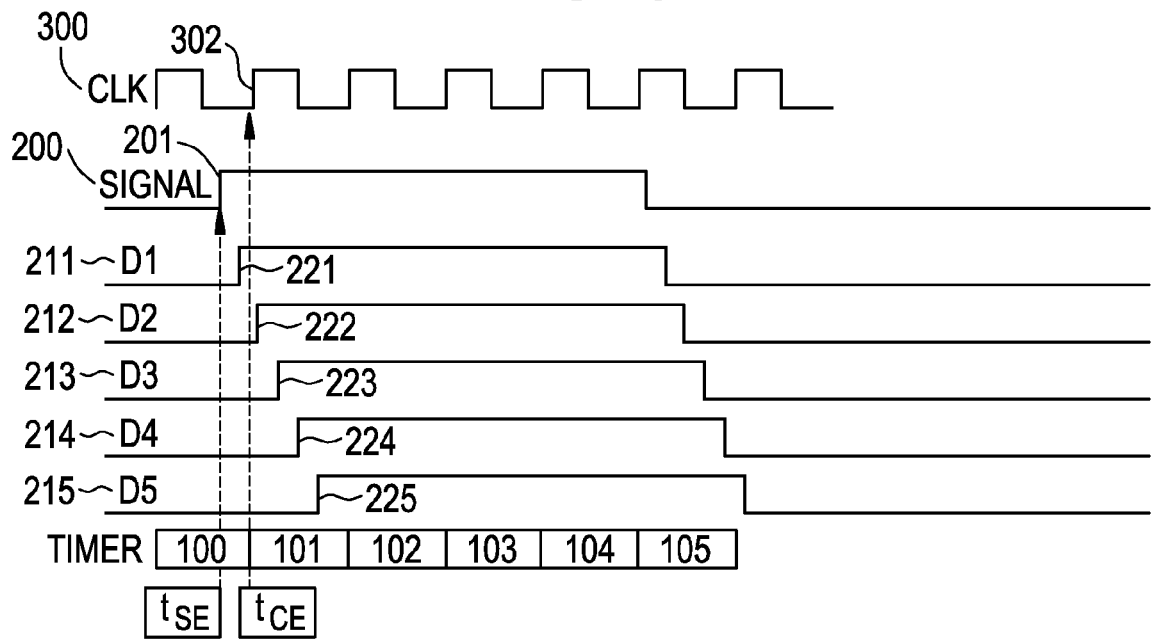
FIG. 3 is an exemplary timing diagram.

In addition to being received by the input of the tapped delay line 10, the signal 200 is also connected to a timer counter capture register 30 that continuously counts the number of timer clock cycles from the timer clock signal 300, as shown in the exemplary timing diagram of FIG. 3 (e.g., counting the first timer clock cycle (100), second timer clock cycle (101), etc.) The timer counter capture register 30 also continuously monitors the signal 200 to detect signal timing edges 201 that indicate the start of a signal cycle (e.g., the rising edge of the signal 200). Although the embodiments illustrated detect the rising edge of the signal 200 as the signal timing edge 201 (and the rising edge of the timer clock signal 300 as the clock timing edge 302), a skilled artisan will appreciate that detection of a variety of signal timing edges (e.g., falling edges) are within the scope and the spirit of the invention. In operation, the detection of the signal timing edge 201 initiates a capture of the current timer clock cycle count ($C_S$) of the timer clock in the timer counter capture register 30. As shown in the exemplary timing diagram of FIG. 3, the signal timing edge 201 is detected at time $t_{SE}$ when the timer clock cycle count ($C_S$) in the timer counter capture register 30 is 100. However, it is not until time $t_{CE}$ (the detection of the next clock timing edge 302 of the timer clock signal 300 that marks the beginning of a timer clock cycle) immediately following the signal timing edge 201) that the timer clock cycle count ($C_S$) for the signal timing edge 201 is actually captured and can be outputted by the timer counter capture register 30.

Also on the next clock timing edge 302 at time $t_{CE}$, the delay line latch 20 captures and can output the state (S) of the tapped delay line 10, which is provided by the outputs of the delay line taps. For example, in the exemplary timing diagram of FIG. 3, at the next clock timing edge 302 at time $t_{CE}$, the state of the delay line latch 20 is 10000 (i.e., the first delay line tap signal 211 from the first delay 11 is high ($D_1$=1), while that state of the remaining four delay line tap signals are low ($D_2$=$D_3$=$D_4$=$D_5$=0)). As shown in FIG. 3, the first delay line tap signal 211 is high ($D_1$=1) since the first delay line tap signal timing edge 221 (i.e., rising edge in this example) occurred before the next clock timing edge 302 while the remaining delay line tap signals are low since their delay line tap signal timing edges occurred after the next clock timing edge 302. As will be demonstrated, monitoring the state (S) of the delay line latch 20 allows fractional correction time values to be applied to the timer clock cycle count ($C_S$) or the time equivalent to the timer clock cycle count ($C_S$) (both of which "correspond to" the timer clock cycle count ($C_S$) or clock cycle as the terms "correspond" and "corresponding" are used herein) to account for the delay between the detection of the signal timing edge 201 at time $t_{SE}$ and the actual capture of the timer clock cycle count ($C_S$) at the next clock timing edge 302 of the timer clock signal 300 at time $t_{CE}$. It is these fractional correction time values that improve the resolution of the reciprocal counters 1, 2.

Referring again to FIG. 1, the reciprocal counter 1 has a five-stage tapped delay line 10 (N=5) providing at least six possible states (S=N+1) for the delay line latch 20. Once again using the example of a system having a 10 MHz timer clock signal 300 (i.e., timer clock period ($T_C$) of 100 ns) with individual delay line tap time delays of $t_D$=20 ns (one-fifth of the timer clock period ($T_C$) or 0.20 of timer clock cycle to provide a resolution improvement factor of F=5), the following Table 1 illustrates the correlation between the state (S) of the delay line latch 20 and the delay range between the detection of the signal timing edge 201 at time $t_{SE}$ and the actual capture of the timer clock cycle count ($C_S$) at the next clock timing edge 302 of the timer clock signal 300 at time $t_{CE}$:

TABLE 1

| | | Delay Range | | |
|---|---|---|---|---|
| State (S) | Delay Line Latch ($D_1D_2D_3D_4D_5$) | # of Time Delays ($t_D$) | $t_D$ = 20 ns | Timer Clock Cycles |
| S1 | 00000 | 0 to 1 $t_D$ | 0 to 20 ns | 0.00 to 0.20 |
| S2 | 10000 | 1 to 2 $t_D$ | 20 to 40 ns | 0.20 to 0.40 |
| S3 | 11000 | 2 to 3 $t_D$ | 40 to 60 ns | 0.40 to 0.60 |
| S4 | 11100 | 3 to 4 $t_D$ | 60 to 80 ns | 0.60 to 0.80 |
| S5 | 11110 | 4 to 5 $t_D$ | 80 to 100 ns | 0.80 to 1.00 |
| S6 | 11111 | 5 $t_{D+}$ | 100 ns+ | 1.00+ |

Referring again to the exemplary timing diagram of FIG. 3, the state of the delay line latch 20 at time $t_{CE}$ is 10000 (i.e., the first delay line tap signal 211 from the first delay 11 is high ($D_1$=1), while the states of the remaining four delay line tap signals are low ($D_2$=$D_3$=$D_4$=$D_5$=0)). As per Table 1, this state (S2) indicates that the signal timing edge 201 at time $t_{SE}$ occurred 1 to 2 tap delays ($t_D$) (i.e., 0.20 to 0.40 of a timer clock cycle or 20 to 40 ns in the example) before the capture of the timer clock cycle count ($C_S$=100) at the next clock timing edge 302 of the timer clock signal 300 at time $t_{CE}$. Rather than a signal timing edge timestamp based solely on this initial time value of a timer clock cycle 100 or 10 ms (i.e., for a timer clock cycle count of $C_S$=100, the equivalent time is 100 times the timer clock period ($T_C$=100 ns)), this initial time value should be adjusted by a fractional correction time value based on the delay range. For example if the delay range is 0.20 to 0.40 of a timer clock cycle or 20 to 40 ns in the example having a timer clock period ($T_C$) of 100 ns, the added fractional correction time value could be in the range of 0.60 to 0.80 of a timer clock cycle or 60 to 80 ns (i.e., 1.00 timer clock cycles minus the delay range (in timer clock cycles) or the timer clock period ($T_C$) minus the delay range In time)). Accordingly, the initial time value corresponding to the output of the timer counter capture register 30 (e.g., timer clock cycle 100 or 10 ms) and the fractional correction time value provided based upon the output of the delay line latch 20 (i.e., the state (S)) (e.g., 0.80 of a timer clock cycle or 80 ns) can be combined (e.g., added) to provide a more accurate signal timing edge timestamp (TS) for the actual time of the signal timing edge 201 (e.g., 100.80 timer clock cycles or 10.080 ms)

In another embodiment, the actual capture of the timer clock cycle count ($C_S$) at the next clock timing edge 302 of the timer clock signal 300 at time $t_{CE}$ can capture the next timer clock cycle count ($C_S$) (i.e., 101) and then subtract the delay range. A skilled artisan will appreciate the fact that embodiments with different fractional correction time values and different methods of applying those fractional correction time values are within the scope and the spirit of the invention.

In one embodiment, this fractional correction time value can be generated by a field programmable gate array (FPGA) designed to correlate particular states (S) with fractional correction time values similar to Table 1. As for combining the initial time value corresponding to the timer clock cycle count ($C_S$) with the fractional correction time value to produce the timestamp (TS), this can be done, e.g., with software, or hardware using priority logic to provide a single binary timestamp value, especially with reciprocal counters using a tapped delay line 10 that divide the timer clock period ($T_C$) by a binary multiple (e.g., 4, 8, 16, etc.). A skilled artisan will appreciate the fact that embodiments with different software methods and hardware used to generate and combine those fractional correction time values are within the scope and the spirit of the invention.

Once the timestamp ($TS_1$) for the signal timing edge 201 has been determined, the process can be repeated to determine the timestamp ($TS_X$) for a subsequent signal timing edge. The subsequent signal timing edge that is timestamped can be, e.g., the next (i.e., second) signal timing edge, the signal timing edge that is detected after some other known number of signal or timer clock cycles, or the signal timing edge that is detected after a known amount of time. In addition, all the signal timing edges can be timestamped with timestamp values selected at some periodic rate to maintain a measurement rate that it is less affected by the frequency (f) of the signal 200. For example, if the timestamp ($TS_2$) for the next (i.e., second) signal timing edge is determined, the difference between the two timestamps ($TS_2$-$TS_1$) would provide the period ($T_S$) of the signal 200 as measured over a single signal cycle (M=1), which can then provide the frequency (f) by reciprocating the period (f=1/$T_S$). Alternatively, if measurement over a number of signal cycles is desired (rather than just a single signal cycle) to provide an average period or average frequency, in one embodiment of the invention, a signal counter capture register can be used to provide and associate a signal cycle count ($M_X$) with a timestamp ($TS_X$) for that signal cycle (e.g., triggered by a signal timing edge). In this embodiment, the frequency (f) of the signal 200 can be determined by dividing the number of signal cycles between timestamps ($M_X$-$M_1$) by the time interval between timestamps ($T_X$-$T_1$) while the period ($T_S$) of the signal 200 would be the reciprocal (i.e., the time interval between timestamps ($T_X$-$T_1$) divided by the number of signal cycles between timestamps ($M_X$-$M_1$)).

Referring again to Table 1, and more specifically to state S6, it should be noted that this last state enabled by the provision of the fifth delay line tap 15, occurs only when the timestamp delay as measured by the reciprocal counter 1 was greater than one timer clock period ($T_C$=100 ns), which should never occur unless the total delay provided by the tapped delay line 10, because of tolerances and errors in the delay line taps, provides less than one timer clock period of delay. Accordingly, for many applications, this last delay line tap 15 (and state S6) can be omitted as shown in FIG. 2. In other words, to improve the resolution of a conventional reciprocal counter by a desired resolution improvement factor of five (F=5), a tapped delay line 10 having only four delay line taps (N=F−1) as in FIG. 2 (rather than five delay line taps as in FIG. 1) but still providing at least five possible states (S) can also be provided with the delay line tap time delay ($t_D$) for each delay equal to the timer clock period ($T_C$) divided by five (as in FIG. 1).

Assuming that that the tapped delay lines 10 of the embodiments used with the invention includes delay line taps with identical delay line tap time delays ($t_D$) equal to the timer clock period ($T_C$) divided by the desired resolution improvement factor ($t_D=T_C/F$), the different possible states (S1-S5) of the delay line latch 20 shown in Table 1 should occur with equal probability (i.e., 20% (or 0.20)) over a statistically significant number of timestamps. However, if the actual times delays for the individual delay line taps vary from ideal delay line tap time delays, the actual occurrence of the various states can change. As will be demonstrated, the count of actual occurrences of one or more of the states compared with the ideal probability of occurrences for those states can provide information on the actual delay line tap time delays introduced by the individual delay line taps, which can be used to modify the fractional correction time values. Knowledge of these actual delay line tap time delays can also be used with adjustable tapped delay line to correct any delay line tap time delay error and regain the ideal probability.

Consider an example related to the embodiment disclosed in FIG. 2 where the number of occurrences of the last state (S5) are counted along with the total number of signal cycles (M) over a statistically significant number of timestamps to determine the relative percentage that the last state (S5) actually occurs compared to the ideal equal probability of 20%.

As can be seen by the exemplary timing diagram of FIG. 3 and Table 1, the occurrence of state S5 is determined by whether the cumulative delay line tap time delay caused by the first delay line tap 11 through the fourth delay line tap 14 results in the fourth delay line tap signal 214 going to a high state before clock timing edge 302 at time $t_{CE}$ when the delay line latch 20 captures and can output the state (S) of the tapped delay line 10. A shorter cumulative delay line tap time delay makes it more likely that the fourth delay line tap signal 214 will go to a high state before clock timing edge 302 at time $t_{CE}$ (i.e., the fourth delay line tap signal timing edge occurred before the next clock timing edge 302) and therefore increase the number of occurrences of state S5. For example, if the relative occurrence of the last state (S5) is found to be 28% (i.e., an increase over the 20% ideal), that indicates that the cumulative delay line tap time delay caused by the first delay line tap 11 through the fourth delay line tap 14 is shorter than ideal (i.e., shorter than 80 ns), with each delay line tap 111, 112, 113, 114 having an average of approximately 10% (i.e., 40% total error in last stage divided by four delay line taps) less time delay than ideal (i.e., 18 ns instead of 20 ns) resulting in a cumulative delay line tap time delay of 72 ns. Knowledge of this approximate error of 10% in the delay line taps allows for modification of the ideal ranges for fractional correction time values to be applied as shown in Table 2.

TABLE 2

| State (S) | Delay Line Latch ($D_1D_2D_3D_4$) | Ideal Occurrence | Ideal Delay Range | Actual Occurrence | Actual Delay Range |
|---|---|---|---|---|---|
| S1 | 0000 | 20% | 0 to 20 ns | — | 0 to 18 ns |
| S2 | 1000 | 20% | 20 to 40 ns | — | 18 to 36 ns |
| S3 | 1100 | 20% | 40 to 60 ns | — | 36 to 54 ns |
| S4 | 1110 | 20% | 60 to 80 ns | — | 54 to 72 ns |
| S5 | 1111 | 20% | 80 to 100 ns | 28% | 72 to 100 ns |

For example, given these estimated actual delay line tap time delays, the factional correction for the state S3 should be selected based on the known delay range of 36 to 54 ns (rather than the ideal range of 40 to 60 ns).

Consider another example related to the embodiment disclosed in FIG. 2 where the numbers of occurrences of the all of the states (S1-S5) are counted over a statistically significant number of timestamps to determine the relative percentage that the states occur compared to the ideal equal probability of 20%. As can be seen by the exemplary timing diagram of FIG. 3 and Table 1, the occurrence of each of the states is determined by whether the cumulative delay line tap time delay caused by the preceding delay line taps results in the delay line tap signal going to a high state before clock timing edge 302 at time $t_{CE}$ when the delay line latch 20 captures and can output the state (S) of the tapped delay line 10. A shorter cumulative delay line tap time delay makes it more likely that a particular tap signal will go to a high state and therefore increase the number of occurrences of that state. Consider the example in Table 3 below related to the embodiment disclosed in FIG. 2 where the actual occurrences of the first two states (S1, S2) occur 18% of the time (instead of 20% ideal), the third and fourth states (S3, S4) occur 20% of the time (ideal), and the fifth state occurs 24% of the time (instead of 20% ideal):

TABLE 3

| State (S) | Delay Line Latch $(D_1D_2D_3D_4)$ | Ideal | | Actual | |
|---|---|---|---|---|---|
| | | Occurrence | Delay Range | Occurrence | Delay Range |
| S1 | 0000 | 20% | 0 to 20 ns | 18% | 0 to 18 ns |
| S2 | 1000 | 20% | 20 to 40 ns | 18% | 18 to 36 ns |
| S3 | 1100 | 20% | 40 to 60 ns | 20% | 36 to 56 ns |
| S4 | 1110 | 20% | 60 to 80 ns | 20% | 56 to 76 ns |
| S5 | 1111 | 20% | 80 to 100 ns | 24% | 76 to 100 ns |

Given that the actual occurrence for the first state (S1) was 18%, which represents a 10% reduction from ideal, it can be estimated that the actual delay line tap time delay for the first delay line tap 11 is actually reduced to 18 ns rather than the ideal 20 ns. Similarly, it can be estimated that the actual delay line tap time delay for the second delay line tap 12 is actually reduced to 18 ns rather than the ideal 20 ns. Since each of these delay line tap time delays are less than ideal, there is less probability that a signal timing edge 201 will occur during these delay stages relating to S1 and S2. On the other hand, since the total delay line tap time delay introduced by the first four delay line taps 111, 112, 113, and 114 is 76 ns (rather than the ideal 80 ns), there is a higher probability that the fourth delay line tap signal 214 will go to a high state before clock timing edge 302 at time $t_{CE}$ and therefore increase the number of occurrences of state S5. Knowledge of these approximate errors in the delay line taps allows for a modification of the ideal ranges for fractional correction time values to be applied to the initial values of the timer clock cycle count $(C_S)$, which were assumed ideal delay line tap time delay. For example, given these estimated actual delay line tap time delays, the factional correction for the state S3 should be selected based on the known delay range from 36 to 56 ns (rather than the ideal range of 40 to 60 ns).

Figure 4:
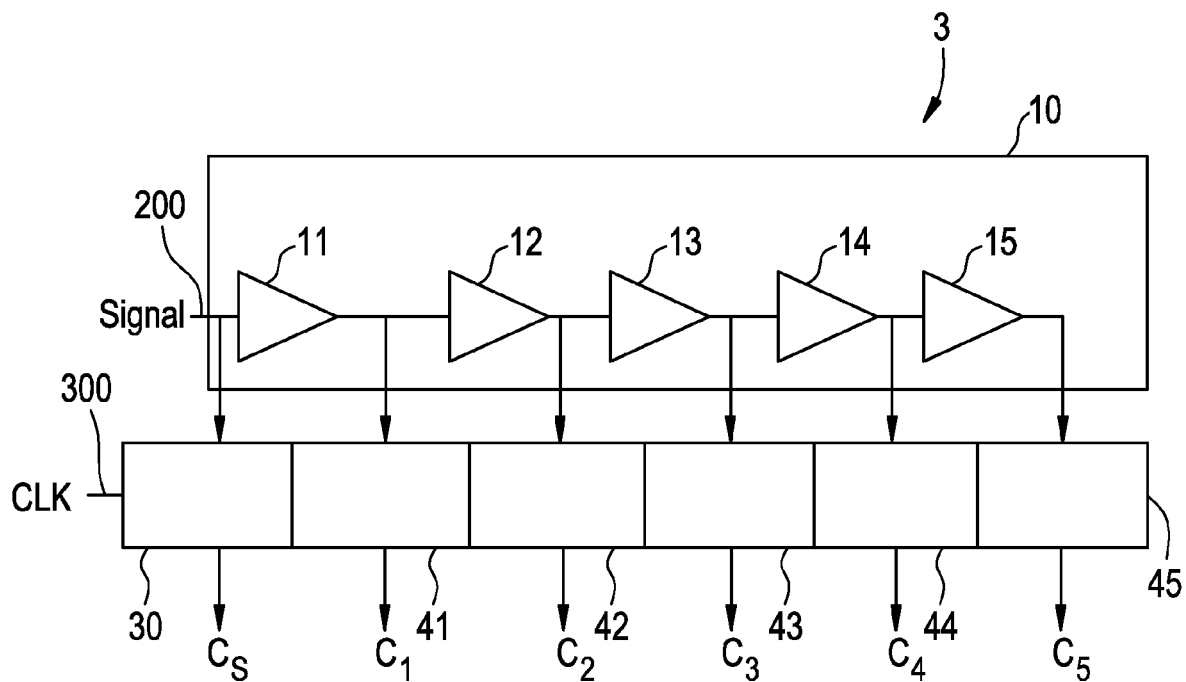
FIG. 4 is a block diagram of a four-stage reciprocal counter using multiple timer counter capture registers in another embodiment of the invention.

Referring to FIG. 4, in yet another embodiment, instead of using a delay line latch 20 as used FIGS. 1 and 2, multiple and separate delay line tap timer counter capture registers 41, 42, 43, 44, 45 for the delay line tap signals 211, 212, 213, 214, 215 are used to capture the delay line timer clock cycle counts $(C_1, C_2, C_3, C_4, C_5)$ at the respective delay line tap signal timing edges 221, 222, 223, 224, 225 of the delay line tap signals 211, 212, 213, 214, 215. A skilled artisan will appreciate the fact that embodiments with both separate and consolidated counter capture registers are within the scope and the spirit of the invention. As shown in the exemplary timing diagram of FIG. 3, captured delay line timer clock cycle counts $(C_1, C_2, C_3, C_4, C_5)$ will differ if the delay line tap signal timing edges 221, 222, 223, 224, 225 of the delay line tap signals 211, 212, 213, 214, 225 are in different timer clock cycles (e.g., 100 and 101). The five delay line timer clock cycle counts $(C_1$ through $C_5)$ are examined after the final delay line tap timer counter capture register 45 captures its timer count $(C_5)$ to ensure that all delay line tap timer counter capture registers 41, 42, 43, 44, 45 have captured the delay line timer clock cycle counts $(C_1$ through $C_5)$ on the current or previous timer clock cycle For example, for a signal 200 having a signal timing edge 201 occurring at a timer clock cycle count of 100 $(C_S=100)$, the following Table 4 shows the possible states (S) of the tapped delay line 10 and associated delay line timer clock cycle counts $(C_1$ through $C_5)$ along with the timestamp (TS) based on the average of the five delay line timer clock cycle counts:

TABLE 4

| State (S) | Delay Line Timer Clock Cycle Counts $(C_1, C_2, C_3, C_4, C5)$ | Timer Count Sum | Timestamp (TS) | Delay Range | |
|---|---|---|---|---|---|
| | | | | # of Time Delays $(t_D)$ | $t_D = 20$ ns |
| S1 | 101, 101, 101, 101, 101 | 505 | 101.00 | 0 to 1 $t_D$ | 0 to 20 ns |
| S2 | 100, 101, 101, 101, 101 | 504 | 100.80 | 1 to 2 $t_D$ | 20 to 40 ns |
| S3 | 100, 100, 101, 101, 101 | 503 | 100.60 | 2 to 3 $t_D$ | 40 to 60 ns |
| S4 | 100, 100, 100, 101, 101 | 502 | 100.40 | 3 to 4 $t_D$ | 60 to 80 ns |
| S5 | 100, 100, 100, 100, 101 | 501 | 100.20 | 4 to 5 $t_D$ | 80 to 100 ns |

Since, as shown in Table 4, the timestamp (TS) is corrected based on the average value of the delay line timer clock cycle counts, there is no need to apply fractional correction time values. Accordingly, given that the exemplary timing diagram of FIG. 3 would result in the S2 state, the timestamp for the signal timing edge 201 would be 100.80 timer clock cycles. In another embodiment, rather than provide the timestamp in terms of timer clock cycles, the timestamp and delay line timer clock cycle counts $(C_1$ through $C_5)$ can be provided in terms of the times equivalent to the timer clock cycles (e.g., timer count sum of 504 timer clock cycles is equivalent to a time sum of 50.4 ms, with an average of 10.080 ms).

In the disclosed embodiments of the invention, it is not necessary to reset or stop the reset either the timer counter capture register 30 or the signal counter capture register as simple unsigned arithmetic can be used to determine the differences between the timestamps (TS) and signal cycle counts (M) regardless of rollover or overflow. However, the counters must be large enough to avoid complete wraparound between the timestamps (TS) or between the signal cycle counts (M).

As demonstrated, the methods of the invention provide timestamps (TS) for the signal timing edges to determine the frequency (f) or period $(T_S)$ of the signal 200 with greater resolution than can be provided by the timer clock signal 300 of a conventional reciprocal counter without requiring an increase in timer clock speed, which avoids increases in power consumption, complexity, and costs of the systems.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for determining a timestamp for a signal timing edge of a signal, said method comprising the steps of:
   (a) providing a timer clock signal having a tinier clock period;
   (b) inputting said signal into a tapped delay line comprising a plurality of delay line taps in series, each of said plurality of delay line taps delaying said signal by a delay line tap time delay less than said timer clock period;
   (c) producing a plurality of delay line tap signals at the output of said plurality of delay line taps, wherein each of said delay line tap signals is said signal delayed by the sum of said delay line tap time delays of the preceding delay line taps in series;
   (d) detecting said signal timing edge;
   (e) detecting the next clock timing edge after said signal timing edge;
   (f) determining an initial time value corresponding to the timer clock cycle count at said signal timing edge or at said next clock timing edge;
   (g) determining the state of said tapped delay line at said next clock timing edge by determining the number of delay line tap signal timing edges that occur before said next clock timing edge;
   (h) determining a fractional correction time value based on said state of said tapped delay line to account for the delay between said signal timing edge and said next clock edge, wherein said fractional correction time value is a fraction of said timer clock period based on said sum of said delay line tap time delays experienced by the last of said plurality of delay line signals to have a delay line tap signal timing edge that occurs before said next clock timing edge; and
   (i) determining said timestamp for said signal timing edge by adjusting said initial time value by said fractional correction time value.

2. The method of claim 1, wherein said adjusting said first initial time value by said first fractional correction time value comprises the step of subtracting said first fractional correction time value from said first initial time value.

3. The method of claim 1, further comprising the steps of:
   determining the actual number of occurrences of said state of said tapped delay line over a statistically significant number of said timestamps;
   determining the actual percentage of occurrences of said state relative to the total number of states or cycles of said signal over said statistically significant number of said timestamps;
   determining the ideal percentage of occurrences of said state based on the ideal delay line tap time delays of said delay line taps; and
   comparing said actual percentage of occurrences of said state to said ideal percentage of occurrences of said state to determine the actual delay line tap time delay of at least one of said delay line taps;
   wherein said fractional correction time value is further based on said actual delay line tap time delay of at least one of said delay line taps.

4. The method of claim 1, wherein said state of said tapped delay line is determined by monitoring all of said plurality of delay line tap signals.

5. The method of claim 1, wherein said state of said tapped delay line is determined by monitoring less than all of said plurality of delay line tap signals.

6. The method of claim 1, wherein each of said plurality of delay line taps delay said signal by an equal delay line tap time delay.

7. The method of claim 6, wherein said equal delay line tap time delay is equal to said tinier clock period divided by the number of said delay line taps.

8. The method of claim 6, wherein said equal delay line tap time delay is equal to said timer clock period divided by less than the number of said delay line taps.

9. The method of claim 1, wherein said initial time value is said timer clock cycle count at said signal timing edge multiplied by said timer clock period.

10. The method of claim 1, wherein said adjusting said initial time value by said fractional correction time value comprises the step of combining said fractional correction time value and said initial time value.

11. The method of claim 1, wherein said adjusting said initial time value by said fractional correction time value comprises the step of subtracting said fractional correction time value from said initial time value.

12. A method for determining a timestamp for a signal timing edge of a signal for use in determining the frequency or period of said signal, said method comprising the steps of:
   (a) providing a timer clock signal having a timer clock period for one timer clock cycle;
   (b) inputting said signal into a tapped delay line comprising a plurality of delay line taps in series, each of said plurality of delay line taps delaying said signal by a delay line tap time delay less than said timer clock period;
   (c) producing a plurality of delay line tap signals at the output of said plurality of delay line taps, wherein each of said delay line tap signals is said signal delayed by the sum of said delay line tap time delays of the preceding delay line taps in series;
   (d) detecting said signal timing edge;
   (e) determining a plurality of delay line timer clock cycle counts corresponding to the timer clock cycle counts at the delay line tap signal timing edges; and
   (f) determining said timestamp for said signal timing edge by determining the average of said plurality of delay line timer clock cycle counts.

13. The method of claim 12, wherein each of said plurality of delay line taps delay said signal by an equal delay line tap time delay.

14. The method of claim 13, wherein said equal delay line tap time delay is equal to said timer clock period divided by the number of said delay line taps.

15. The method of claim 13, wherein said equal delay line tap time delay is equal to said timer clock period divided by less than the number of said delay line taps.

16. The method of claim 12, wherein said plurality of said delay line timer clock cycle counts are said timer clock cycle counts at said delay line tap signal timing edges multiplied by said timer clock period.

17. A method for determining the frequency of a signal, said method comprising the steps of:
   (a) providing a timer clock signal having a timer clock period;
   (b) inputting said signal into a tapped delay line comprising a plurality of delay line taps in series, each of said plurality of delay line taps delaying said signal by a delay line tap time delay less than said timer clock period;

(c) producing a plurality of delay line tap signals at the output of said plurality of delay line taps, wherein each of said delay line tap signals is said signal delayed by the sum of said delay line tap time delays of the preceding delay line taps in series;

(d) detecting a first signal timing edge;

(e) detecting the next clock timing edge after said first signal timing edge;

(f) determining a first initial time value corresponding to the timer clock cycle count at said first signal timing edge or at said next clock timing edge;

(g) determining the state of said tapped delay line at said next clock timing edge by determining the number of delay line tap signal timing edges that occur before said next clock timing edge;

(h) determining a first fractional correction time value based on said state of said tapped delay line to account for the delay between said first signal timing edge and said next clock edge, wherein said first fractional correction time value is a fraction of said timer clock period based on said sum of said delay line tap time delays experienced by the last of said plurality of delay line signals to have a delay line tap signal timing edge that occurs before said next clock timing edge;

(i) determining a first timestamp for said first signal timing edge by adjusting said initial time value by said fractional correction time value;

(j) repeating steps (d) though (i) to determine a second timestamp for a second signal timing edge;

(k) determining the time interval between said first timestamp and said second timestamp;

(l) determining the signal cycle count for the number of signal cycles during said time interval; and (m) determining the frequency of said signal by dividing said signal cycle count by said time interval.

18. The method of claim 17, wherein each of said plurality of delay line taps delay said signal by an equal delay line tap time delay.

19. The method of claim 17, wherein said first initial time value is said timer clock cycle count at said first signal timing edge multiplied by said timer clock period.

20. The method of claim 17, wherein said adjusting said first initial time value by said first fractional correction time value comprises the step of combining said first fractional correction time value and said first initial time value.

* * * * *

UNITED STATES PATENT AND TRADEMARK OFFICE
CERTIFICATE OF CORRECTION

| | | |
|---|---|---|
| PATENT NO. | : 8,422,340 B2 | Page 1 of 1 |
| APPLICATION NO. | : 12/329978 | |
| DATED | : April 16, 2013 | |
| INVENTOR(S) | : Hutchinson | |

It is certified that error appears in the above-identified patent and that said Letters Patent is hereby corrected as shown below:

In the Specifications:

In Column 2, Line 14, delete "ns)" and insert -- ns). --, therefor.

In Column 5, Line 67, delete "ms)" and insert -- ms). --, therefor.

In the Claims:

In Column 11, Line 12, in Claim 1, delete "tinier" and insert -- timer --, therefor.

In Column 12, Line 11, in Claim 7, delete "tinier" and insert -- timer --, therefor.

In Column 14, Line 6, in Claim 17, delete "though" and insert -- through --, therefor.

Signed and Sealed this
Eighteenth Day of June, 2013

Teresa Stanek Rea
*Acting Director of the United States Patent and Trademark Office*